(12) United States Patent
Shibayama et al.

(10) Patent No.: US 9,603,274 B2
(45) Date of Patent: Mar. 21, 2017

(54) CONTAINER FOR HOUSING ELECTRONIC COMPONENT AND ELECTRONIC DEVICE

(71) Applicant: KYOCERA Corporation, Kyoto-shi, Kyoto (JP)

(72) Inventors: Hiroshi Shibayama, Kyoto (JP); Shigenori Takaya, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 34 days.

(21) Appl. No.: 14/415,330

(22) PCT Filed: Sep. 19, 2013

(86) PCT No.: PCT/JP2013/075313
§ 371 (c)(1),
(2) Date: Jan. 16, 2015

(87) PCT Pub. No.: WO2014/069123
PCT Pub. Date: May 8, 2014

(65) Prior Publication Data
US 2015/0195935 A1    Jul. 9, 2015

(30) Foreign Application Priority Data

Oct. 30, 2012 (JP) ................. 2012-238512

(51) Int. Cl.
*H05K 5/00* (2006.01)
*H05K 5/02* (2006.01)
*H01L 23/053* (2006.01)

(52) U.S. Cl.
CPC ......... *H05K 5/0247* (2013.01); *H01L 23/053* (2013.01); *H01L 2924/0002* (2013.01); *H05K 5/0091* (2013.01)

(58) Field of Classification Search
CPC ... H05K 5/0247; H05K 5/0091; H01L 23/053
See application file for complete search history.

(56) References Cited

U.S. PATENT DOCUMENTS 6,365,961 B1 * 4/2002 Tomie .............. H01L 23/66
257/664
6,796,725 B2 * 9/2004 Velsher ............. G02B 6/4248
385/92

(Continued)

FOREIGN PATENT DOCUMENTS

| JP | 11-17041 A | 1/1999 |
| JP | 2004-153165 A | 5/2004 |

(Continued)

OTHER PUBLICATIONS

International Search Report, PCT/JP2013/075313, Date of Mailing: Dec. 10, 2013, 1 pg.

*Primary Examiner* — Xantha C Cunningham
(74) *Attorney, Agent, or Firm* — Volpe and Koenig, P.C.

(57) ABSTRACT

A container for housing an electronic component includes: a container body including a bottom plate and a polygonal side wall surrounding a central region of the bottom plate, the container body housing an electronic component inside a cavity defined by the bottom plate and the polygonal side wall; and an input-output terminal that penetrates through the polygonal side wall and is attached to two sides of the polygonal side wall, wherein a first side of the polygonal side wall is adjacent to a second side of the polygonal side wall, wherein the input-output terminal includes an insulator and a conductor, and wherein the conductor penetrates through the insulator and provides electrical continuity between an interior portion of the polygonal side wall and an exterior portion of the polygonal side wall.

7 Claims, 6 Drawing Sheets

(56) References Cited

U.S. PATENT DOCUMENTS

| | | | | |
|---|---|---|---|---|
| 6,992,250 | B2* | 1/2006 | Kubota | H01L 23/047 |
| | | | | 174/549 |
| 8,653,649 | B2* | 2/2014 | Tsujino | H01L 23/057 |
| | | | | 257/664 |
| 8,929,097 | B2* | 1/2015 | Nakasaka | H01L 23/473 |
| | | | | 361/688 |
| 2004/0131318 | A1* | 7/2004 | Mori | G02B 6/4201 |
| | | | | 385/92 |
| 2005/0207092 | A1* | 9/2005 | Kubota | H01L 23/047 |
| | | | | 361/301.3 |
| 2010/0091464 | A1* | 4/2010 | Ohnishi | H01L 23/053 |
| | | | | 361/723 |
| 2010/0252313 | A1* | 10/2010 | Tsujino | H01L 23/057 |
| | | | | 174/260 |
| 2011/0048796 | A1* | 3/2011 | Tsujino | H01L 23/49833 |
| | | | | 174/549 |
| 2014/0008780 | A1* | 1/2014 | Tsujino | H01L 23/057 |
| | | | | 257/690 |

FOREIGN PATENT DOCUMENTS

| | | | | |
|---|---|---|---|---|
| JP | 2004-356340 A | | 12/2004 | |
| JP | 2006-066867 A | | 3/2006 | |
| JP | 5537736 B | * | 6/2011 | ............. H01L 24/42 |

* cited by examiner

CONTAINER FOR HOUSING ELECTRONIC COMPONENT AND ELECTRONIC DEVICE

TECHNICAL FIELD

The present invention relates to the shape of a container for housing an electronic component such as a container for housing a semiconductor device, and an electronic device constructed by housing an electronic component in the container for housing an electronic component, and more particularly relates to a container for housing an electronic component equipped with a multi-terminal type input-output terminal, and an electronic device.

BACKGROUND ART

In order to protect an electronic component such as a semiconductor device from the influence of surrounding environment, the electronic component is hermetically enclosed in a container for housing an electronic component. In recent years, for example, as more than one electronic component are stored inside a container, and as the packing density of electronic components has been increased, the number of electric signals to be inputted/outputted between a container and electronic components is increasing. In consequence, line conductors for input/output signals of a container for housing an electronic component tend to grow in number. An example of such a conventional container for housing an electronic component (hereafter also referred to simply as "container") is shown in FIG. 5 (refer to Patent Literature 1, for instance).

The conventional container comprises: a metal-made bottom plate 101 having a substantially rectangular plate form; a side wall 102 joined to an upper surface of the bottom plate 101 so as to surround a central region of the bottom plate 101; and an input-output terminal 103 joined to the side wall 102. The side wall 102 is obtained by joining a front frame portion 102b and a side wall portion 102d together. The front frame portion 102b is provided with an insertion hole 102c to permit insertion of a connector of an optical fiber. The side frame portion 102d is U-shaped, which is disposed along three sides of the bottom plate 101 (except for the front frame portion 102b). The side frame portion 102b is formed so as to be lower in height than the front frame portion 102b. The input-output terminal 103, which is also U-shaped, is joined to the upper end face of the side frame portion 102d via a brazing material.

The input-output terminal 103 is made of ceramics. A metallized wiring 104 is formed on a ceramics-made shelf-like portion 103a protruding inside and outside of the container. A lead terminal 105 is joined to the metallized wiring 104 located outside the container, and, the lead terminal 105 is connected to an external circuit.

Moreover, in the input-output terminal 103 located inside the container, the metallized wiring 104 formed on the upper surface of the shelf-like portion 103a is connected with an electronic component or a terminal of a substrate by means of a bonding wire or otherwise. The metallized wiring 104 and the lead terminal 105 provide electrical connection between the electronic component placed inside the container and the external circuit.

CITATION LIST

Patent literature

Patent Literature 1: Japanese Unexamined Patent Publication JP-A 11-17041 (1999)

SUMMARY OF INVENTION

Technical Problem

However, in such a conventional container, wiring lines are led out in three directions from the container in order to implement a multi-terminal structure. Therefore, in the three directions about the container, there is a need to secure space for the process of connecting the protruding shelf-like portion 103a with the lead terminal 105.

Furthermore, also inside the container, in inward three directions, there is a need to secure space for the process of connecting a bonding wire or the like to the protruding shelf-like portion 103a and the metallized wiring 104. As above described, in the conventional container, extra space needs to be secured both inside and outside the container in three directions about the container, which gives rise to an obstacle to space saving.

Thus, the invention has been devised in view of the problems associated with the conventional art as mentioned supra, and accordingly an object of the invention is to provide a downsizable container for housing an electronic component which necessitates less space, and an electronic device.

Solution to Problem

According to an embodiment of the invention, a container for housing an electronic component includes: a container body for housing the electronic component inside a cavity defined by a bottom plate and a polygonal side wall surrounding a central region of the bottom plate; and an input-output terminal that penetrates through the polygonal side wall and is attached to two sides of the polygonal side wall, wherein a first side of the polygonal side wall is adjacent to a second side of the polygonal side wall, wherein the input-output terminal includes an insulator and a conductor, and wherein the conductor penetrates through the insulator and provides electrical continuity between an interior portion of the polygonal side wall and an exterior portion of the polygonal side wall.

In the above-described construction, it is preferable that, at an outside of the first side or the second side adjacent thereto of the polygonal side wall, an external terminal of the conductor of the input-output terminal which is exposed from the insulator is substantially parallel to an outer side face of the polygonal side wall.

In the above-described construction, it is preferable that a plurality of the external terminals are disposed in a plurality of rows along the first side or the second side adjacent thereto of the polygonal side wall.

In the above-described construction, it is preferable that the conductor which provides electrical continuity between the interior portion of the polygonal side wall and the exterior portion of the polygonal side wall is routed from an outside of the first side to an inside of the second side adjacent thereto of the polygonal side wall, or from an inside of the first side to an outside of the second side adjacent thereto of the polygonal side wall.

In the above-described construction, it is preferable that the input-output terminal has a projection protruding outwardly along the polygonal side wall, and the external terminal of the conductor is disposed on both surfaces of the projection.

According to an embodiment of the invention, an electronic device includes: the container for housing an electronic component having the above-described construction; and an electronic component housed inside the cavity.

Advantageous Effects of Invention

According to the container for housing an electronic component in accordance with one embodiment of the invention, the container comprises an input-output terminal that penetrates through the polygonal side wall and is attached to two sides of the polygonal side wall, wherein a first side of the polygonal side wall is adjacent to a second side of the polygonal side wall, wherein the input-output terminal includes an insulator and a conductor, and wherein the conductor penetrates through the insulator and provides electrical continuity between an interior portion of the polygonal side wall and an exterior portion of the polygonal side wall. Since the input-output terminal is attached only in two directions about the polygonal side wall of the container body; that is, attached only to the first side and the second side of the polygonal side wall, it is possible to save space required for connecting process outside the container body. Moreover, also inside the container body, it is possible to save space required for the process of connection with an electronic component and so forth, and thereby make the container compact.

Moreover, in the above-described construction, in a case where, at the outside of the first side or the second side adjacent thereto of the polygonal side wall, an external terminal of the conductor of the input-output terminal which is exposed from the insulator is substantially parallel to the outer side face of the polygonal side wall, there is no need to secure space for terminal connection in a direction around the container body that is perpendicular to the polygonal side wall, wherefore space saving can be achieved outside the container.

Moreover, in the above-described construction, in a case where a plurality of the external terminals are disposed in a plurality of rows along the first side or the second side adjacent thereto of the polygonal side wall, it is possible to increase the number of connection terminals in the container.

Moreover, in the above-described construction, in a case where the conductor which provides electrical continuity between the interior portion of the polygonal side wall and the exterior portion of the polygonal side wall is routed from an outside of the first side to an inside of the second side adjacent thereto of the polygonal side wall, or from an inside of the first side to an outside of the second side adjacent thereto of the polygonal side wall, it is possible to increase flexibility in conductor disposition, and thereby dispose the conductors at higher density.

Moreover, in the above-described construction, in a case where the input-output terminal has a projection protruding outwardly along the polygonal side wall, and the external terminal of the conductor is disposed on both surfaces of the projection, it is possible to increase the number of the external terminals.

In the electronic device pursuant to the invention, with the provision of the container for housing an electronic component having the above-described structure and an electronic component housed inside the cavity, less space is required around the container, and the container can be made compact, and consequently, it is possible to provide a compact electronic device.

DESCRIPTION OF EMBODIMENTS

Figure 1:
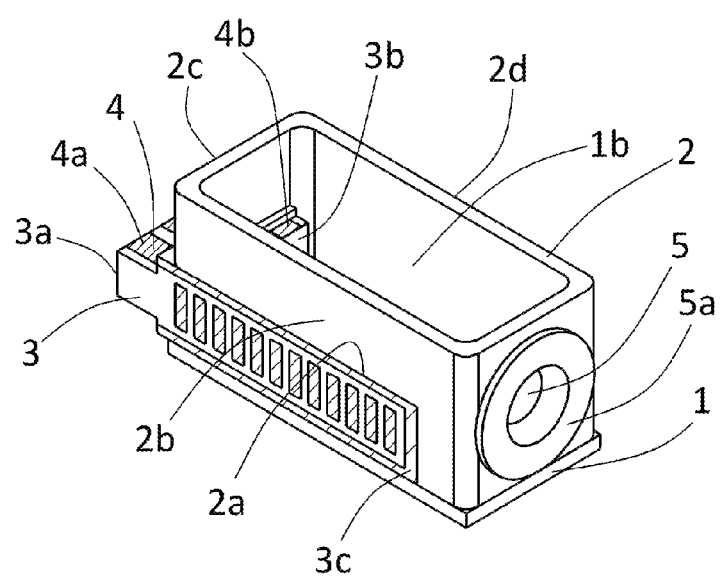
FIG. 1 is a perspective view showing an example of a container for housing an electronic component according to an embodiment of the invention.
Figure 2:
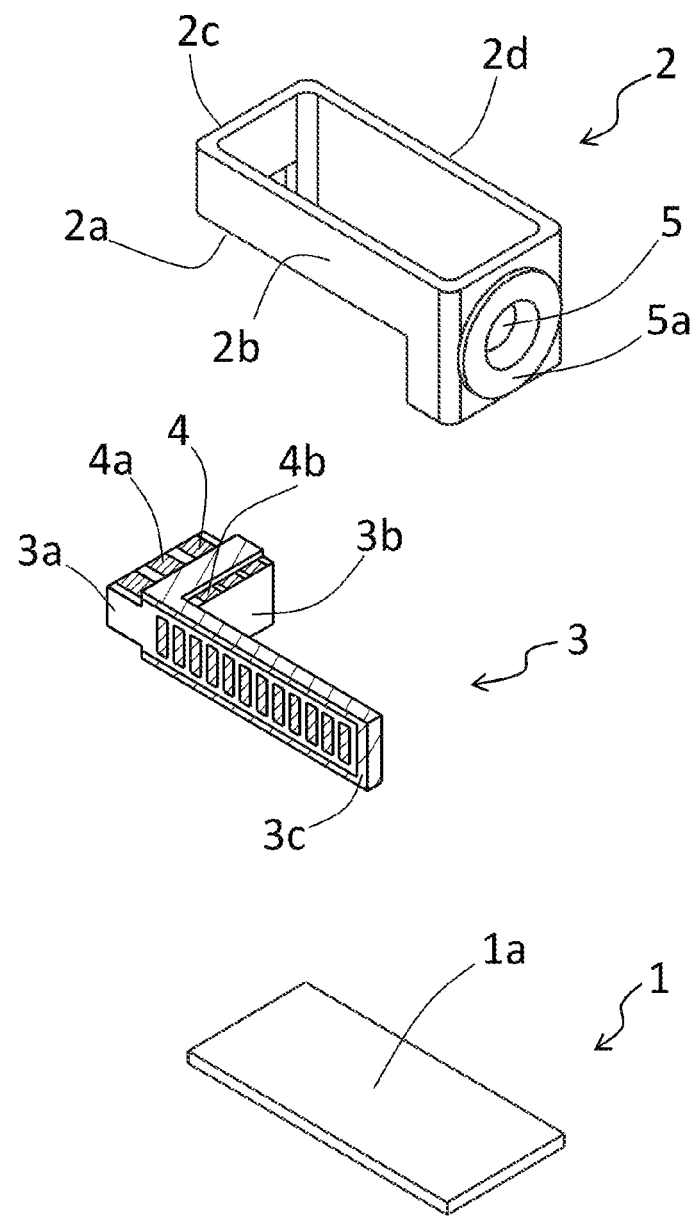
FIG. 2 is an exploded perspective view of the container for housing an electronic component shown in FIG. 1.
Figure 3A:
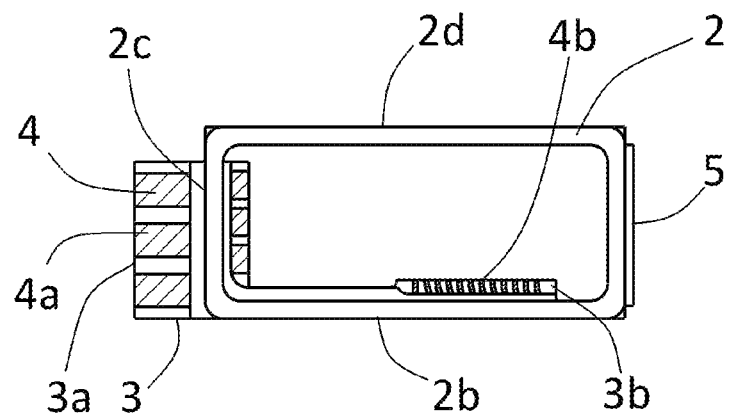
FIG. 3A is a plan view of the container for housing an electronic component shown in FIG. 1.
Figure 3B:
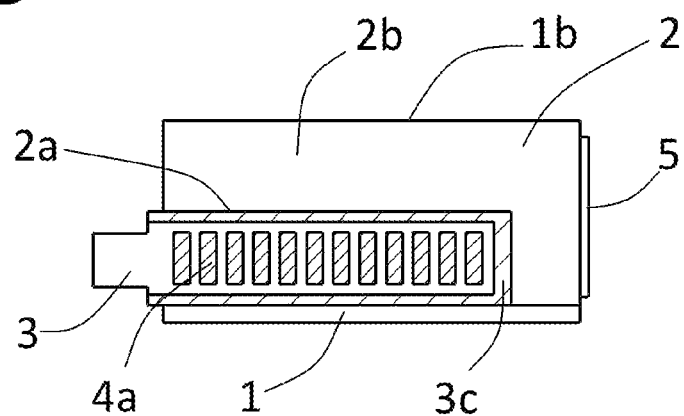
FIG. 3B is a side view of the container for housing an electronic component shown in FIG. 1.
Figure 3C:
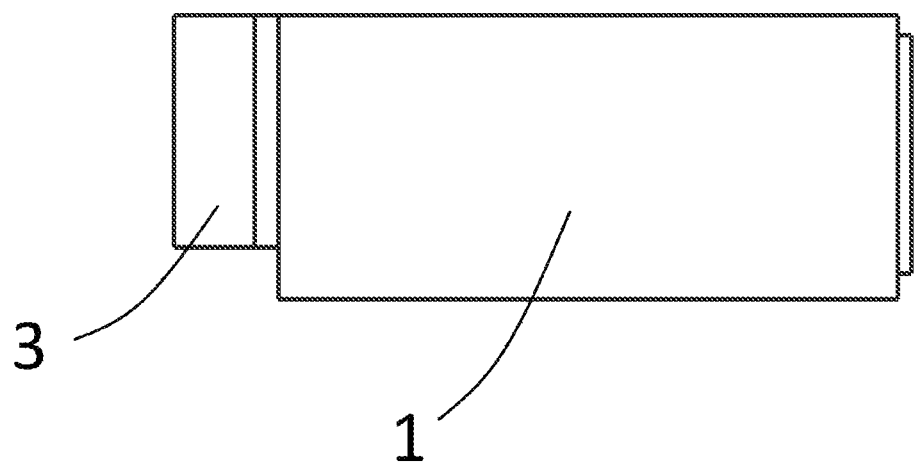
FIG. 3C is a bottom view of the container for housing an electronic component shown in FIG. 1.

A container for housing an electronic component and an electronic device according to an embodiment of the invention will be described below in detail. FIG. 1 is a perspective view showing an example of the container for housing an electronic component according to an embodiment of the invention, and FIG. 2 is an exploded perspective view of the container for housing an electronic component shown in FIG. 1, and, FIGS. 3A, 3B, and 3C are a plan view, a side view, and a bottom view, respectively, of the container for housing an electronic component shown in FIG. 1. In these drawings, in order to facilitate the understanding of the construction, a region where a metal layer of an input-output terminal 3 is formed is hatched. The hatched region is not intended to indicate a cross section.

As shown in FIGS. 1, 2, and 3 (FIGS. 3A, 3B, and 3C), the container for housing an electronic component comprises: a metal-made bottom plate 1 in the form of a polygonal plate having a placement region 1a located centrally of an upper main surface thereof for the placement of an electronic component; and a side wall 2 disposed at the outer periphery of the upper main surface of the bottom plate 1 so as to surround the placement region 1a. A place surrounded by the bottom plate 1 and the side wall 2 constitutes a cavity 1b. An electronic component is mounted on the placement region 1a while being housed within the cavity 1b. The following description deals with a case where the bottom plate 1 and the side wall 2 are rectangular shaped as seen in a plan view thereof by way of example.

The side wall 2 has a mounting part 2a for the installation of the input-output terminal 3, which is formed as a through part in a midportion of the side wall spaced away from the bottom plate 1, or a through part obtained by cutting a lower end or upper end of the side wall. FIGS. 1, 2, and 3 exemplify a mounting part 2a obtained by cutting the lower end of the side wall 2. The mounting part 2a is formed integrally and continuously with two faces 2b and 2c which are the face 2b including a first side of the side wall 2 and the face 2c including a second side adjacent to the first side of the side wall 2.

The input-output terminal 3 is mounted in the mounting part 2a via a joining material such as a brazing material. The input-output terminal 3 is made as an integral continuation of the two faces 2b and 2c of the mounting part 2a. Moreover, the input-output terminal 3 has a conductor 4 which provides electrical continuity between the interior portion of the side wall 2 and the exterior portion of the side wall 2. In the example shown in FIGS. 1, 2, and 3, an L-shaped input-output terminal 3 extending over the two faces 2b and 2c is installed. The input-output terminal 3 is formed so as to extend from the face 2b to the face 2c. The input-output terminal 3 is opposed to the face 2b, but is not extended to a face 2d adjacent to the face 2c, as well as a face opposed to the face 2c. However, from an installation viewpoint, the input-output terminal 3 may be designed so that a conductor 4-free continuous part is extended to the face 2d.

Moreover, the input-output terminal 3 is formed with a plurality of conductors 4 which provide electrical continuity between the interior portion of the side wall 2 and the exterior portion of the side wall 2. The input-output terminal 3 has, at its part located outside the side wall 2, a projection 3a protruding in a shelf-like form outwardly from the side wall 2, just as with the form of a face 2c-sided part of the input-output terminal 3 as shown in FIGS. 1 to 3, for example. The input-output terminal 3 also has a projection 3b protruding in a shelf-like form inwardly from the side wall 2. An external terminal 4a of the conductor 4 is formed on an upper surface or lower surface of the projection 3a. An internal terminal 4b is formed on the upper surface of the projection 3b. Although, in FIGS. 1 to 3, the projection 3a, 3b is provided only on the face 2c-sided part, it is needless to say that the projection 3a, 3b may also be provided on a face 2b-sided part of the input-output terminal 3. However, in view of a reason which will hereafter be described, it is preferable that the projection 3a is not provided outside the face 2b, so that the lateral surface of the face 2b-sided part can be made flat.

To the external terminal 4a portion of the conductor 4 exposed outside the side wall 2 is joined a lead terminal made of a rod-like metal or the like for electrical connection with an external circuit. Moreover, to the internal terminal 4b portion of the conductor 4 exposed inside the side wall 2 is connected a bonding wire or the like for electrical connection with an electrode or the like of an electronic component.

The input-output terminal 3 is disposed so as to extend over the two faces 2b and 2c, but is not located on the face 2d. Therefore, the projection 3a, 3b will not be disposed inside or outside the face 2d, which makes it possible to save space required for the placement of the projection 3a, 3b inside and outside the face 2d. Moreover, there is no need to secure space for connecting process to join the lead terminal to the external terminal 4a portion outside the face 2d, as well as to join the lead terminal to an external circuit. In addition, there is no need to secure space for the process of connecting a bonding wire or the like to the internal terminal 4b portion. This makes it possible to save space required for the connecting process on an external circuit board located outside the face 2d. Simultaneously, it is also possible to save space inside the face 2d, and thereby make the container compact.

The external terminal 4a may be formed so as to extend, in a narrow-strip form, in a direction parallel to the face 2b of the side wall 2, for example, in a vertical direction of the container, just as with the form of the face 2b-sided part as shown in FIGS. 1, 2, and 3, for example. By forming the external terminal 4a in this way, it is possible to eliminate the need to provide the projection 3a, as well as to perform connection of the lead terminal in a direction parallel to the face 2b of the side wall 2, and thereby achieve space saving outside the side wall 2.

Moreover, it never occurs that thermal stress resulting from the difference in thermal expansion between the side wall 2 and the input-output terminal 3 is concentrated on the corner of the projection 3a protruding from the side wall 2. Thus, a crack will not be developed at the corner, wherefore the airtightness of the container for housing an electronic component can be maintained with ease. Moreover, the lateral surface of the face 2b-sided part of the input-output terminal 3 may be made flush with the face 2b. This makes it possible to save space outside the face 2b even further. Also, the rigidity of the face 2b-sided part of the input-output terminal 3 can be maintained.

It is noted that further space saving can be achieved by using a flexible wiring substrate instead of the lead terminal for the process of making connection with the external terminal 4a. The flexible wiring substrate lends itself to formation of wiring conductors at high density, wherefore, as compared with the case of using the lead terminal, it is possible to arrange the external terminals 4a more densely, and thereby increase the number of wiring lines.

In this case, the external terminal 4a does not necessarily have to be perfectly parallel to the face 2b, but may be formed at a slight angle with respect to the face 2b. For example, by disposing the external terminal 4a so that it extends outwardly and upwardly at an angle of 5° to 15° with respect to the face 2b, it is possible to reduce the extent of flection of a flexible substrate which is connected laterally to the container.

In FIG. 4 (FIGS. 4A, 4B, 4C, and 4D), there are shown various examples of disposition of such an external terminal 4a. By disposing the external terminals 4a in a plurality of rows instead of disposing them circumferentially along the side wall 2 in a horizontal row as shown in FIGS. 1, 2, and 3, it is possible to increase the density of disposition of the external terminals 4a, and thereby increase the number of the external terminals 4a.

Figure 4A:
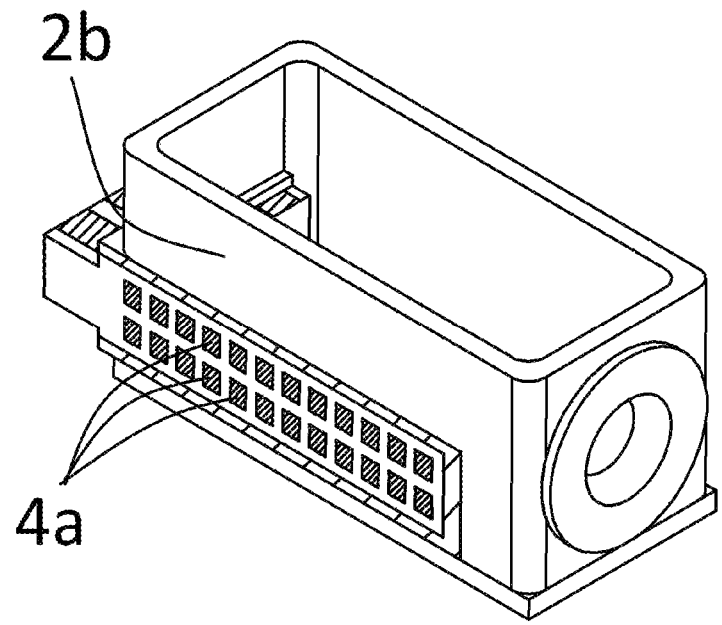
FIG. 4A is a perspective view showing another example of the container for housing an electronic component according to the embodiment of the invention.

FIG. 4A shows a case where the face 2b-sided external terminals 4a are disposed in two rows in the vertical direction of the container. In this case, the external terminals 4a, which are each brought into continuity with the internal terminal 4b, can be disposed at higher density. Note that two vertically-disposed external terminals 4a may be obtained by splitting one and the same signal terminal into two and disposing them. As the result of division of a junction between the external terminal 4a and the lead terminal or the flexible substrate, when the lead terminal or the flexible substrate is joined to the external terminal 4a with a brazing material, each component requires less area to be subjected to brazing, wherefore a reduction in resultant stress can be achieved.

Figure 4B:
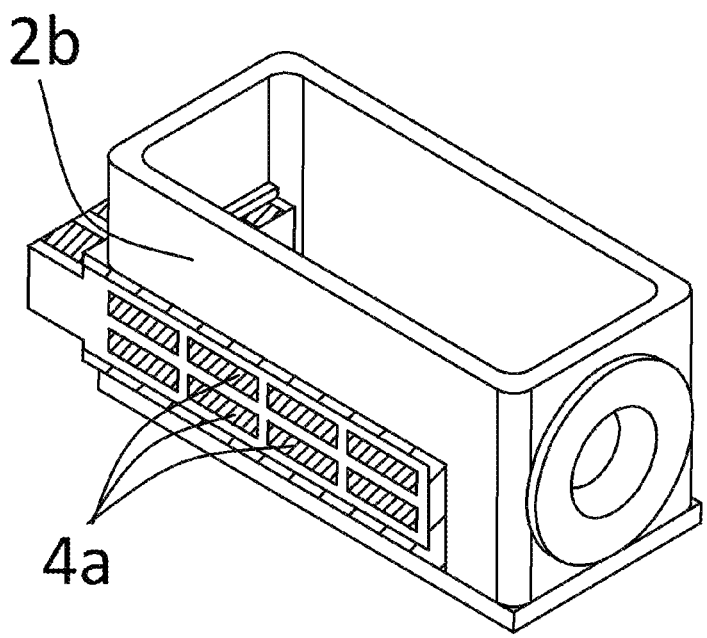
FIG. 4B is a perspective view showing another example of the container for housing an electronic component according to the embodiment of the invention.

FIG. 4B shows a case where the face 2b-sided external terminals 4a are disposed in two rows in the vertical direction, and the external terminal 4a is designed so that its horizontal length is longer than its vertical length. In this case, it is possible to suppress a connection failure caused by a misalignment between the lead terminal or the flexible substrate and the external terminal 4a in the horizontal direction that occurs during connection of these components.

Figure 4C:
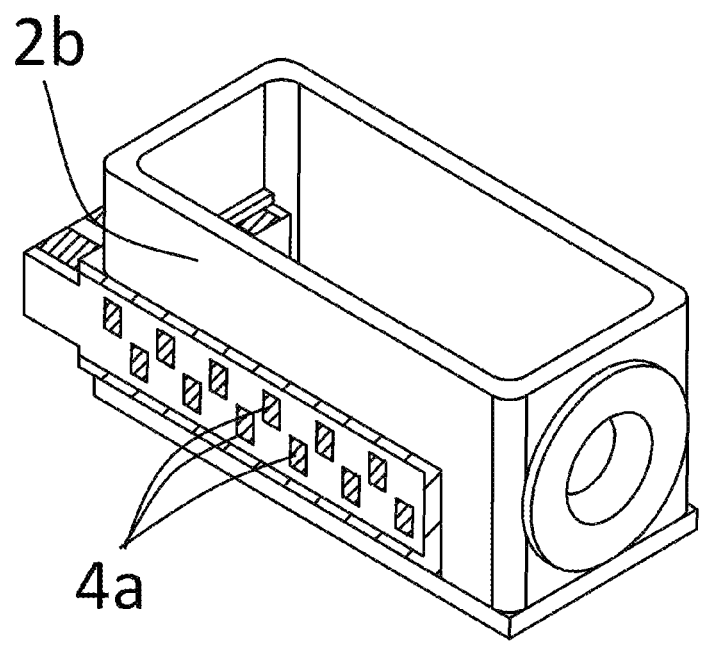
FIG. 4C is a perspective view showing another example of the container for housing an electronic component according to the embodiment of the invention.

FIG. 4C shows a case where the face 2b-sided external terminals 4a are separated into upper and lower groups in the vertical direction of the container so that the upper and lower external terminals 4a can be staggered with respect to each other in the vertical direction in a check pattern. In this case, when the lead terminal or the flexible substrate is joined to the external terminal 4a via an electrically-conductive member such as a brazing material, it is possible to suppress occurrence of a connection failure such as electrical short-circuiting between the external terminals 4a arranged proximate to each other.

Figure 4D:
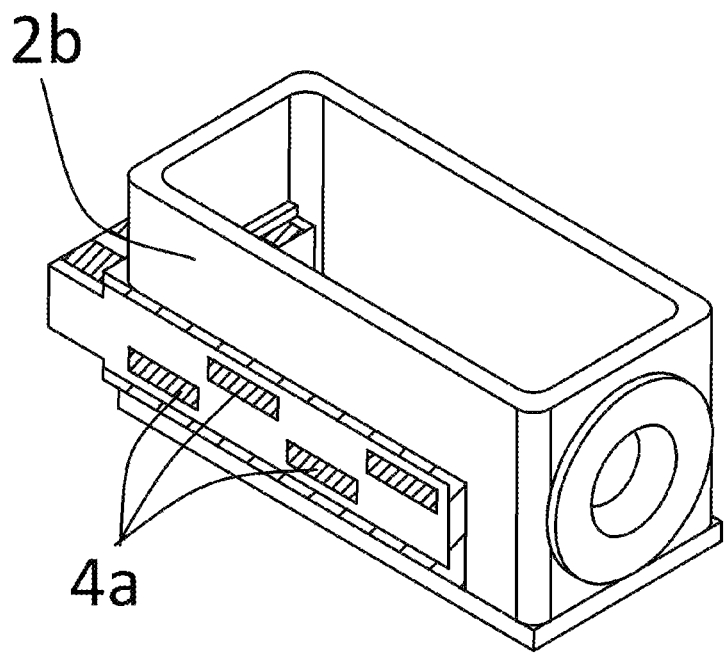
FIG. 4D is a perspective view showing another example of the container for housing an electronic component according to the embodiment of the invention.
Figure 5:
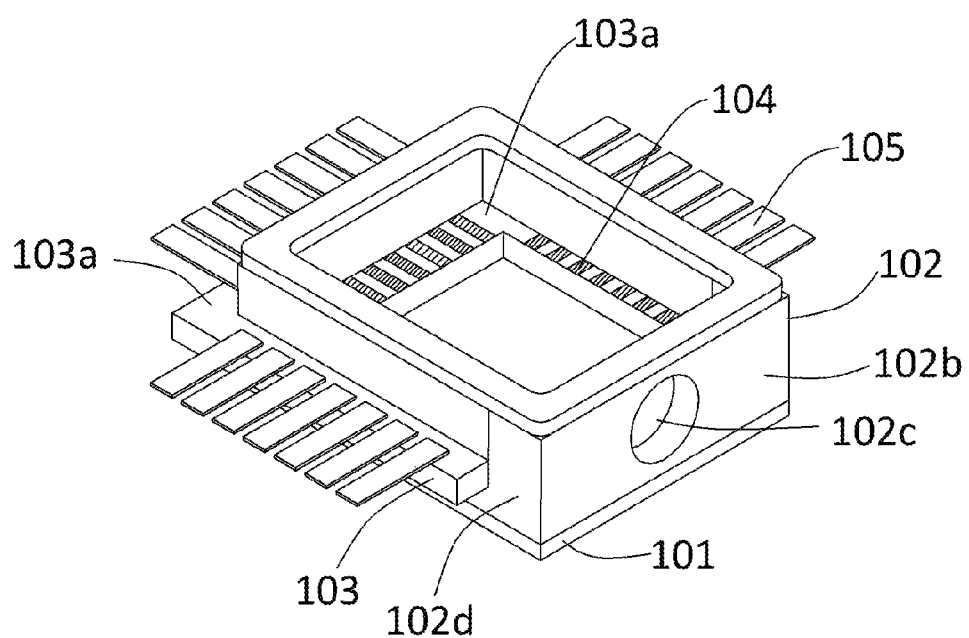
FIG. 5 is a perspective view showing an example of a conventional container for housing an electronic component.

FIG. 4D shows a case where the face 2b-sided external terminals 4a are arranged in two rows in the vertical direction of the container as an upper group and a lower group, and the upper and lower external terminals 4a are staggered with respect to each other in the vertical direction, and also the external terminal 4a is designed so that its horizontal length is longer than its vertical length. In this case, when the lead terminal or the flexible substrate is joined to the external terminal 4a via an electrically-conductive member such as a brazing material, it is possible to suppress occurrence of a connection failure such as electrical short-circuiting between the external terminals 4a disposed proximate to each other. Moreover, it is possible to suppress a connection failure caused by a misalignment between the lead terminal or the flexible substrate and the external terminal 4a in the horizontal direction that occurs during connection of these components.

The conductor 4 may be configured so as to be routed in the stacked inner layers of the input-output terminal 3. As shown in FIG. 3A, part of the external terminals 4a located outside the face 2c may be connected directly to the internal terminal 4b at the face 2c after penetrating through the face 2c, or may be connected to the internal terminal 4b lying on the projection 3b located inside the face 2b. On the other hand, the external terminal 4a located outside the face 2b may be connected to the internal terminal 4b at the face 2c. In this way, the internal wiring of the input-output terminal 4 for providing connection between the external terminal 4a at the face 2b, 2c and the internal terminal 4b at the face 2b, 2c can be routed freely.

As will be understood from FIG. 3A, in the input-output terminal 3, the projection 3b located inside the face 2b is formed in a position spaced away from the face 2c, and, the part between the projection 3b and the face 2c is made narrower in width. Moreover, the projection 3b-bearing part is greater than the part between the face 2c and the projection 3b in terms of the width of the area to be joined to the bottom plate 1.

Thus, in the input-output terminal 3, its rigidity can be enhanced at the projection 3a which is susceptible to stress concentration resulting from the difference in thermal expansion between the bottom plate 1, as well as the side wall 2, and the input-output terminal 3, wherefore cracking or the like problem is less prone to occur. Meanwhile, in the part between the projection 3b and the face 2c, since the area of the junction between the bottom plate 1, as well as the side wall 2, and the input-output terminal 3 is reduced, it is possible to decrease the stress resulting from the thermal expansion difference.

Moreover, it is advisable that the input-output terminal 3 is formed so as to extend from the face 2b to the face 2c, but is not extended to the face 2d opposed to the face 2b and the face opposed to the face 2c. This makes it possible to suppress stress concentration on the corner caused by the difference in thermal expansion between the bottom plate 1, as well as the side wall 2, and the input-output terminal 3, and ensuing cracking or separation of each structural component.

In one embodiment of the container as above described, the bottom plate 1 is a flat plate made of a metal such for example as an iron (Fe)-nickel (Ni)-cobalt (Co) alloy, a Fe—Ni alloy, a copper (Cu)-tungsten (W) alloy, a Cu-molybdenum (Mo) alloy, or Cu. For example, the bottom plate 1 is obtained by the working of an ingot made of a Fe—Ni—Co alloy or the like into a predetermined shape such as a rectangular plate having predetermined dimensions using a heretofore known metalworking technique such as a rolling method or a punching method. The central region of the upper surface of the bottom plate 1 serves as the placement region 1a on which an electronic component 4 such as a semiconductor device is placed.

Moreover, the side wall 2 disposed so as to surround the placement region 1a is, like the bottom plate 1, made of a metal such as a Fe—Ni—Co alloy, a Fe—Ni alloy, a Cu—W alloy, a Cu—Mo alloy, or Cu, and, the side wall 2 is disposed at the outer periphery of the upper surface of the bottom plate 1 by being formed integrally with the bottom plate 1, by being brazed to the bottom plate 1 via a brazing material such as Ag solder, or by being joined to the bottom plate 1 by a welding technique such as a seam welding method. For example, such a side wall 2 is obtained by the working of an ingot made of a Fe—Ni—Co alloy or the like into a predetermined shape having predetermined dimensions using a heretofore known metalworking technique such as the rolling method or a punching method.

The side wall 2 has, at its side parts, the mounting part 2a in which the input-output terminal 3 is fitted, and a window 5 for inputting and outputting an optical signal on an as needed basis. A light-transmittable window member is joined to the window 5 for hermetically sealing the window 5. Moreover, a member 5a for attachment of an optical component is joined to the outer side of the window 5.

Moreover, the input-output terminal 3 is fitted in the mounting part 2a. For example, a metal layer is formed at a place where the input-output terminal 3 is to be fitted. Then, the input-output terminal 3 is fitted in the mounting part 2a, and a sealing material such as Ag solder is placed, and subsequently heat is applied to melt the sealing material. The molten sealing material is filled in a gap between the input-output terminal 3 and the inner surface of the mounting part 2a by exploiting a capillary phenomenon, thereby fitting the input-output terminal 3 in the mounting part 2a via the sealing material.

In the example shown in FIGS. 1, 2, and 3, a peripheral metal layer 3c of the input-output terminal 3 is formed on, in addition to its surface which is joined into the mounting part 2a, an outer edge of a side surface near the surface. The sealing material wettably spreads out to the peripheral metal layer 3c, thereby joining the side wall 2 and the input-output terminal 3 together more firmly.

The input-output terminal 3 hermetically seals the container at the mounting part 2a, and also has the capability of conducting an electric signal inside and outside the container. The electric signal may be either a DC signal or an AC signal. For example, the input-output terminal 3 is composed of: a rectangular parallelepiped flat plate section made of a dielectric material and having the conductor 4 formed so as to extend from a first side of the upper surface of the projection 4a to the projection 3b located on an opposed second side thereof; and an upstanding wall section made of a dielectric material and joined to the upper surface of the flat plate section in a manner such that the midportion of the conductor 4 is interposed between them, and thus both ends of the conductor 4 are left exposed. On the side of the input-output terminal 3 located outside the side wall 2, a metal-made lead terminal or a flexible substrate is joined to the external terminal 4a of the conductor 4 in order to make connection with an external electric circuit.

The input-output terminal 3 is made of an electrically insulating material, for example, ceramics, and, the conductor 4 is formed so as to penetrate through this ceramics. For example, the input-output terminal 3 is produced by a method of dividing a ceramic mother substrate into a plurality of pieces; that is, a so-called multi-piece segmentation process, using ceramics such as $Al_2O_3$ ceramics, AlN ceramics, or $3Al_2O_3 \cdot 2SiO_2$ ceramics.

In the case of being made for example of $Al_2O_3$ ceramics, the input-output terminal 3 is produced by the following manner. Appropriate organic binder, organic solvent, plasticizer, dispersant, and so forth are admixed in powder of raw materials such as alumina ($Al_2O_3$), silicon oxide ($SiO_2$), magnesium oxide (MgO), and calcium oxide (CaO) in order to prepare a slurry, and the slurry is shaped into a sheet-like form by the heretofore known doctor blade method, whereby a plurality of ceramic green sheets can be obtained.

Next, a plurality of ceramic green sheets for forming the flat plate section are prepared, and they are subjected to appropriate punching process, and then a conductor paste, which is obtained by mixing appropriate binder and solvent with powder of metal such as W, Mo, or manganese (Mn), is print-coated, in a predetermined pattern for the conductor 4, onto the surface of a ceramic green sheet which becomes an upper layer by means of screen printing, gravure printing, or otherwise. The aforementioned conductor paste is also formed by coating on ceramic green sheets which become the surfaces of the input-output terminal 3 that are joined to the bottom plate 1 and the side wall 2 for the sake of brazing.

Next, a plurality of ceramic green sheets for forming the upstanding wall section are prepared, and, a conductor paste for brazing, which is obtained by mixing appropriate binder and solvent with powder of metal such as W, Mo, or Mn, is print-coated, in a predetermined pattern, onto a surface to be joined to the side wall 2 of a ceramic green sheet which becomes an upper layer by means of screen printing, gravure printing, or otherwise.

Next, the laminated body for forming the upstanding wall section is stacked on the layered body for forming the flat plate section under pressure in order to obtain a stacked body which constitutes the input-output terminal 3. Then, a conductor paste for forming a metal layer which is joined to the inner surface of the mounting part 2a, a conductor paste for forming the external terminal 4a at the side face 2b, and so forth are print-coated on the lateral surfaces of the obtained stacked body, and lastly, the stacked body is fired at a high temperature of about 1500° C. to 1600° C., whereupon the input-output terminal 3 can be produced.

It is preferable that, the surface of the conductor layer such as the conductor 4 of the input-output terminal 3 is coated with a metal layer, for example, an Ni layer having a thickness of 0.5 to 9 μm or an Au layer having a thickness of 0.5 to 5 μm by a plating technique in the interest of prevention of oxidative corrosion, improvement in wire bondability, reduction in electrical resistance, and improvement in solderability.

In this way, a compact container for housing an electronic component which occupies less space in an external circuit board can be produced.

Moreover, an electronic device is constructed as a commercial product by placing an electronic component fixedly on the placement region 1a via an adhesive such as a Au-silicon (Si) adhesive, establishing electrical connection between an electrode of the electronic component and the internal terminal 4b of the conductor 4 of the input-output terminal 3 disposed inside the container by means of a bonding wire or otherwise, joining a lid body made of a metal such as a Fe—Ni—Co alloy or a Fe—Ni alloy to the upper surface of the side wall 2 by a brazing technique or a welding technique such as the seam welding method to housing the electronic component inside the container composed of the side wall 2 and the lid body and hermetically seal the container.

This electronic device is used for the purpose of, for example, processing an electric signal, which has been supplied to the electronic component from an external electric circuit via the input-output terminal 3, by the electronic component, and then producing output of the signal into the external electric circuit via the input-output terminal 3. In the case of using a semiconductor light-emitting device or the like as the electronic component, the electronic device can be operated as an optical semiconductor device for inputting and outputting an optical signal through the window 5 formed in the side wall 2 or other place.

It should be understood that the invention is not limited to the embodiments described hereinabove, and therefore various changes and modifications are possible without departing from the scope of the invention. For example, an insulating material such as ceramics or resin may be used for the bottom plate 1, the side wall 2, the lid body, and so forth.

Moreover, the bottom plate 1 and the side wall 2 may be given various shapes as seen in a plan view, for example, in addition to a rectangular shape as shown in FIGS. 1, 2, and 3, other polygonal shape such as an octagonal shape.

Furthermore, as the electronic component 4 which is internally placed, in addition to a semiconductor element made of GaAs, Si, Ge, SiC, or the like, an oscillator, a resistor, a capacitor, various types of electronic components for use in an electric circuit may be applied.

In addition, although, in FIGS. 1, 2, and 3, the input-output terminal 3 is illustrated as being disposed so as to extend from the side face 2b to the side face 2c, the input-output terminal 3 may be also disposed so as to extend from the side face 2d to the side face 2c. In the case of using the container for housing an electronic component having the input-output terminal 3 extending from the side face 2b to the side face 2c and the container for housing an electronic component having the input-output terminal 3 extending from the side face 2d to the side face 2c, these two containers for housing electronic component can be disposed closely side by side, and therefore become suitable for use in, for example, TOSA (Transmitter Optical Sub-Assembly) and ROSA (Receiver Optical Sub-Assembly) applications.

REFERENCE SIGNS LIST

1: Bottom plate
2: Side wall
2a: Mounting part
2b: Face including first side
2c: Face including second side
3: Input-output terminal
3a: (Outside) projection
3b: (Inside) projection
4: Conductor
4a: External terminal
4b: internal terminal
5: Window

The invention claimed is:
1. A container for housing an electronic component, the container comprising:

a container body for housing the electronic component inside a cavity defined by a bottom plate and a polygonal side wall surrounding a central region of the bottom plate; and an input-output terminal that penetrates through the polygonal side wall and is attached to only two sides of the polygonal side wall, wherein a first side of the polygonal side wall is adjacent to a second side of the polygonal side wall, wherein the input-output terminal includes an insulator and a conductor, and wherein the conductor penetrates through the insulator and provides electrical continuity between an interior portion of the polygonal side wall and an exterior portion of the polygonal side wall, and wherein the conductor which provides electrical continuity between the interior portion of the polygonal side wall and the exterior portion of the polygonal side wall is routed from an outside of the first side to an inside of the second side adjacent thereto of the polygonal side wall, or from an inside of the first side to an outside of the second side adjacent thereto of the polygonal side wall.

2. The container for housing an electronic component according to claim 1,
wherein, at an outside of the first side or the second side adjacent thereto of the polygonal side wall, an external terminal of the conductor of the input-output terminal which is exposed from the insulator is substantially parallel to an outer side face of the polygonal side wall.

3. The container for housing an electronic component according to claim 2,
wherein a plurality of the external terminals are disposed in a plurality of rows along the first side or the second side adjacent thereto of the polygonal side wall.

4. An electronic device, comprising:
the container for housing an electronic component according to claim 2; and
an electronic component housed inside the cavity.

5. The container for housing an electronic component according to claim 1,
wherein the input-output terminal has a projection protruding outwardly along the polygonal side wall, and the external terminal of the conductor is disposed on the projection.

6. An electronic device, comprising:
the container for housing an electronic component according to claim 5; and
an electronic component housed inside the cavity.

7. An electronic device, comprising:
the container for housing an electronic component according to claim 1; and
an electronic component housed inside the cavity.

* * * * *